United States Patent
Sofer et al.

(10) Patent No.: US 9,413,351 B2
(45) Date of Patent: Aug. 9, 2016

(54) INTEGRATED CIRCUIT DEVICE AND METHOD OF IMPLEMENTING POWER GATING WITHIN AN INTEGRATED CIRCUIT DEVICE

(75) Inventors: Sergey Sofer, Rishon Lezion (IL); Valery Neiman, Rishon Lezion (IL); Michael Priel, Netanya (IL)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 14/122,556

(22) PCT Filed: Jun. 15, 2011

(86) PCT No.: PCT/IB2011/052602
§ 371 (c)(1),
(2), (4) Date: Nov. 26, 2013

(87) PCT Pub. No.: WO2012/172390
PCT Pub. Date: Dec. 20, 2012

(65) Prior Publication Data
US 2014/0097884 A1    Apr. 10, 2014

(51) Int. Cl.
*G06F 1/26*     (2006.01)
*G06F 1/32*     (2006.01)
*H03K 17/687*   (2006.01)
*H03K 17/00*    (2006.01)
*H03K 19/00*    (2006.01)

(52) U.S. Cl.
CPC ............. *H03K 17/6871* (2013.01); *G06F 1/26* (2013.01)

(58) Field of Classification Search
CPC . H03K 17/00; H03K 17/687; H03K 19/0008; H03K 19/0016; G06F 1/26; G06F 1/3287
See application file for complete search history.

(56) References Cited

U.S. PATENT DOCUMENTS

| | | | |
|---|---|---|---|
| 7,196,954 B2 * | 3/2007 | Suh | 365/207 |
| 7,400,175 B2 * | 7/2008 | Fallah | H03K 19/0019 326/34 |
| 2006/0033551 A1 | 2/2006 | Dong et al. | |
| 2007/0257705 A1 | 11/2007 | Blisson | |
| 2008/0180157 A1 | 7/2008 | Choi et al. | |
| 2009/0146734 A1 * | 6/2009 | Fallah et al. | 327/544 |
| 2010/0097097 A1 | 4/2010 | Kim et al. | |

FOREIGN PATENT DOCUMENTS

| | | |
|---|---|---|
| KR | 10-2008-0080834 A | 9/2008 |
| KR | 10-2010-0013591 A | 2/2010 |

OTHER PUBLICATIONS

International Search Report and Written Opinion correlating to PCT/IB2011/052602 dated Feb. 29, 2012.

* cited by examiner

*Primary Examiner* — Lincoln Donovan
*Assistant Examiner* — Colleen O Toole

(57) ABSTRACT

An integrated circuit device comprises at least one power gating arrangement, including at least one gated power domain, and at least one power gating component operably coupled between at least one node of the at least one gated power domain and at least a first power supply node. The at least one power gating component is arranged to selectively couple the at least one node of the at least one gated power domain to the at least first power supply node.

18 Claims, 3 Drawing Sheets

INTEGRATED CIRCUIT DEVICE AND METHOD OF IMPLEMENTING POWER GATING WITHIN AN INTEGRATED CIRCUIT DEVICE

FIELD OF THE INVENTION

The field of this invention relates to an integrated circuit device and a method of implementing power gating within an integrated circuit device.

BACKGROUND OF THE INVENTION

In the field of integrated circuit devices, power gating or power shut-off is an effective method of leakage power reduction for functional units that have a burst-like application profile. For example, during a 'not-in-use' state for such a functional unit, a power or ground supply of the functional unit may be gated, e.g. de-coupled, using an on-die gating switch, such as a large PMOSFET or NMOSFET (p-channel/n-channel metal oxide semiconductor field effect transistor) in triode mode.

A problem associated with such power gating techniques involves a significant rush of current drawn by the circuitry when the functional unit is subsequently un-gated, i.e. re-coupled to the power or ground supply. This rush of current is, to a large extent due to the charging of parasitic and explicit device capacitances within the circuitry of the functional unit. Such a large rush of current can have a significant and detrimental effect on neighbouring circuits connected to the same power/ground supply. Thus, it is generally desirable to minimise the current drawn by the circuitry when a functional unit is subsequently un-gated.

However, the power-up time for a functional unit depends on the capacitance to be charged and the charge current amplitude. Accordingly, restricting the charge current available when a functional unit is un-gated can also result in the power gating recovery for the functional unit taking longer, reducing the efficiency of the power gating process.

SUMMARY OF THE INVENTION

The present invention provides an integrated circuit device and a method of implementing power gating within an integrated circuit device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
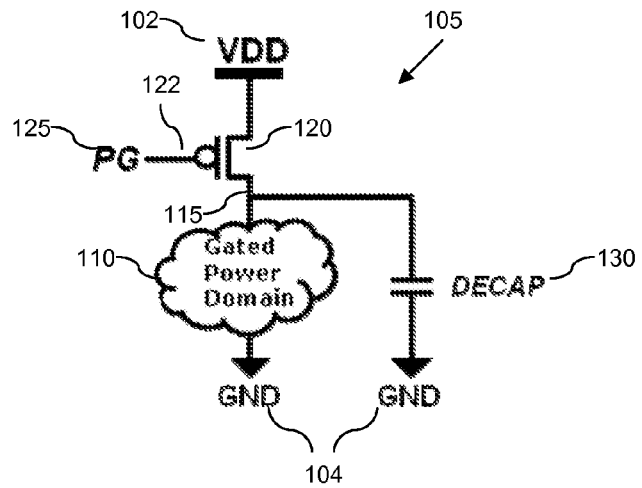
FIG. 1 illustrates a simplified block diagram of an example of a conventional power gating arrangement.

An example of the present invention will now be described with reference to a simplified example of an integrated circuit device within which aspects of the present invention may be implemented. It will be appreciated that the present invention is not limited to the specific implementation illustrated in the drawings, and the simplified illustrated example is only intended to provide an aid to understanding the invention. For the illustrated example, an integrated circuit device is illustrated as comprising a single gated power domain and a single power gating component. However, as will be appreciated, an integrated circuit device may comprise any number of gated power domains, and typically a plurality of such gated power domains. Furthermore, such an integrated circuit device may also comprise more than one power gating component; and more than one power gating component may be arranged to provide power gating functionality to a single gated power domain.

Furthermore, because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Referring first to FIG. 1, there is illustrated a simplified example of a conventional power gating arrangement 105. The power gating arrangement 105 comprises a gated power domain 110, for example comprising one or more functional units. The power gating arrangement 105 further comprises a power gating component 120 operably coupled between a node 115 of the gated power domain 110 and a first power supply node 102. For the illustrated example, the first power supply node comprises a positive supply voltage (VDD). The power gating component 120 comprises a p-channel MOSFET (metal oxide semiconductor field effect transistor), and is arranged to selectively couple the node 115 of the gated power domain 110 to the first power supply node 102.

A capacitance 130, which for the illustrated example comprises a de-coupling capacitance, is operably coupled between the node 115 of the gated power domain 110 and a second power supply node, which for the illustrated example comprises a ground node 104. De-coupling capacitances, such as the de-coupling capacitance 130, stand to mitigate current peaks that are created by actively switching devices like combinatorial logic devices or sequential logic devices. For example, in the case of such devices switching, the power main supply 102 may not be able to immediately provide the necessary amount of charge due to, for example, being effectively connected through resistive and inductive components within an integrated device package, power grid, etc. During an instantaneous voltage droop, de-coupling capacitors serve as secondary charge sources, providing the charge while the main power supply is not effectively available.

During normal operation of the gated power domain 110, for example when the gated power domain 110 is in an 'in use' state, the power gating component 120 may be configured to operably couple the node 115 of the gated power domain 115 to the first power supply node 102. In this manner, during such normal operation, the gated power domain 110 is operably coupled between the first and second power supply nodes 102, 104, and as such is 'powered', and thus able to perform its respective functions. Conversely, when the gated power domain 110 is in a 'not-in-use' state, the power gating component 120 may be configured to gate off, and thus de-couple, the node 115 of the gated power domain 115 from the first power supply node 102. In this manner, by de-coupling the node 115 of the gated power domain 115 from the first power supply node 102, current leakage within the gated power domain 110 may be significantly reduced.

A problem associated with such power gating involves a significant rush of current during power gating recovery, when the gated power domain 110 is subsequently un-gated, i.e. re-coupled to the first power supply node 102 in the illustrated example. This rush of current is to a large extent due to a charging of parasitic and explicit device capacitances, such as the de-coupling capacitance 130 illustrated in FIG. 1.

Figure 2:
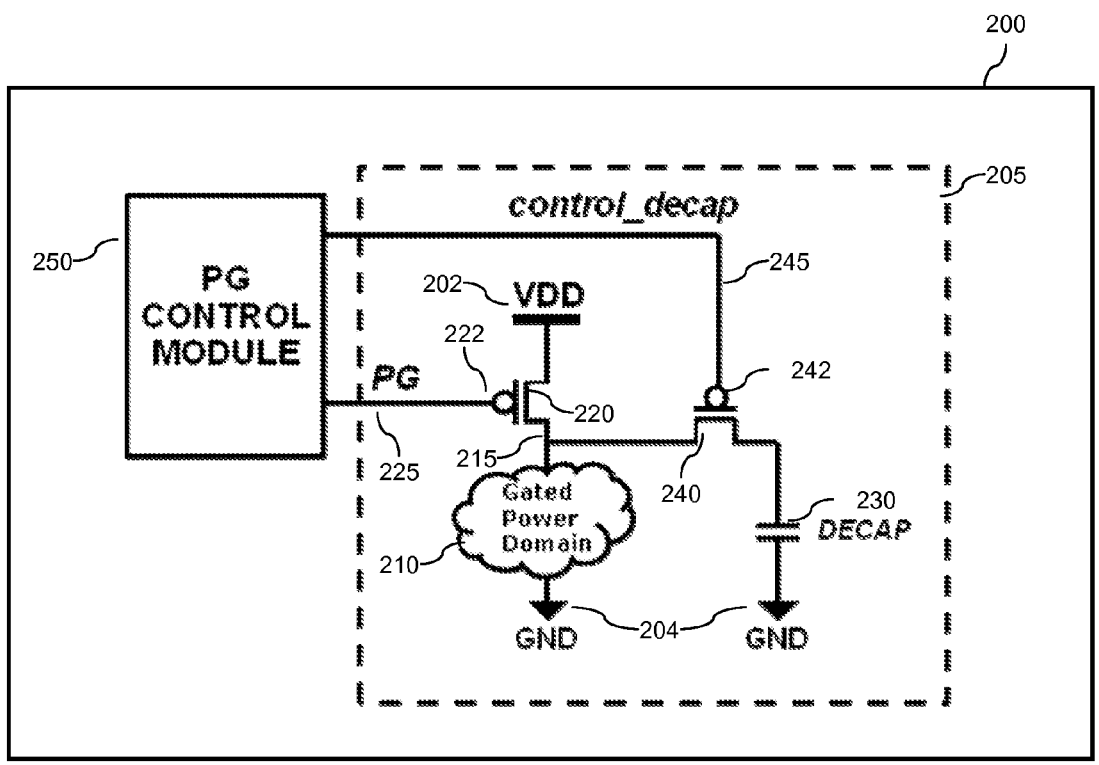
FIG. 2 illustrates a simplified block diagram of an example of an integrated circuit comprising a power gating arrangement.

Referring now to FIG. 2, there is illustrated a simplified block diagram of an example of an integrated circuit device 200 comprising a power gating arrangement 205 according to some example embodiments of the present invention. In the illustrated example, the power gating arrangement 205 comprises a gated power domain 210. The power gating arrangement 205 further comprises a power gating component 220 operably coupled between a node 215 of the gated power domain 210 and a first power supply node 202. For the illustrated example, the first power supply node comprises a positive supply voltage (VDD) of the integrated circuit device 200. The power gating component 220 of the illustrated example comprises a p-channel MOSFET (metal oxide semiconductor field effect transistor), and is arranged to selectively couple the node 215 of the gated power domain 210 to the first power supply node 202. In particular in the illustrated example, the power gating component 220 is arranged to receive a power gating control signal 225 at an input 222 thereof, and to selectively couple the node 215 of the gated power domain 210 to the first power supply node 202 in accordance with the received power gating control signal 225.

A chargeable device, such as a capacitance 230, which in the illustrated example comprises a de-coupling capacitance, is operably coupled between the node 215 of the gated power domain 210 and a second power supply node, which for the illustrated example comprises a ground node 204. In some examples, the capacitance 230 may comprise a distributed capacitor, for example comprising conductive layers within the integrated circuit device 200. For clarity, the capacitance 230 has been illustrated as being coupled directly between the node 215 of the gated power domain 210 and the ground node 204. However, in other examples, the capacitance 230 may be equally coupled to the node 215 of the gated power domain 210 and/or ground node 204 indirectly. Furthermore, the capacitance 230 has also been illustrated as being separate from the gated power domain 210 for clarity and ease of understanding. However, the capacitance 230 may equally comprise an integral part of the gated power domain 210, and is not limited to comprising a de-coupling capacitance. For example, the capacitance 230 is intended only to be representative of at least a part of the capacitance that may be present between, in the illustrated example, the node 215 of the gated power domain 210 and the ground node 204.

The power gating arrangement 205 further comprises at least one isolation component 240 operably coupled in series between the capacitance 230 and the node 215 of the gated power domain 210. The isolation component 240 is arranged to selectively couple the capacitance 230 to the node 215 of the gated power domain 210. For example, and as illustrated in FIG. 2, the isolation component 240 may comprise, say, a metal oxide semiconductor field effect transistor (MOSFET), and may be arranged to receive an isolation control signal 245 at an input 242 thereof, and to selectively couple the capacitance 230 to the node 215 of the gated power domain 210 in accordance with the received isolation control signal 245. In some examples, the isolation component 240 may comprise a thin gate oxide MOSFET device. Advantageously, the use of such a MOSFET device, and in particular a thin gate oxide MOSFET device, provides a sufficiently low resistance when the isolation component 240 is configured to couple the capacitance 230 to the node 215 of the gated power domain 210 to allow an effective de-coupling function of the capacitance 230 during normal operation of the gated power domain 210. As mentioned, in some examples, the capacitance 230 may comprise a distributed capacitor. Accordingly, it is contemplated that for such examples the at least one isolation component 240 may comprise a distributed switch. For example, the isolation component 240 may function as a switch. In this manner, when the isolation control signal 245 enables current flow through the isolation component 240, charging and discharging of the capacitance 230 is allowed. The isolation component may be characterized by the parameter known as $R_{on}$ resistance at an on-state. In some examples, the connecting in parallel of several such components may form a distributed switch. The functionality provided by such a distributed switch may be the same as that provided by a single component switch.

In this manner, the capacitance 230 is able to be selectively isolated, e.g. de-couple, from the node 215 of the gated power domain 215; thereby effectively removing the capacitance 230 from the gated power domain circuitry. In particular, the capacitance 230 may be isolated from the node 215 of the gated power domain 210 during power gating recovery, e.g. when the gated power domain 210 is subsequently un-gated, and thus re-coupled to the first power supply node 202 in the illustrated example. By isolating the capacitance 230 during such power gating recovery, the initial current drawn through the power gating component 220 may be significantly reduced since the capacitance 230 is not required to be charged. As a result, the rush of current during power gating recovery may be significantly reduced, and thus any detrimental effect on neighbouring circuits connected to the same power/ground supply may also be significantly reduced, without increasing the power-up time for the gated power domain 210.

By way of example, and as illustrated in FIG. 2, the integrated circuit device 200 may further comprise a power gating control module 250 arranged to selectively configure the power gating component 220 to gate off the first power supply node 202 from the node 215 of the gated power domain 210. For the illustrated example, the power gating control module 250 is operably coupled to the input 222 of the power gating component 220, and arranged to provide the power gating control signal 225 thereto. In this manner, the power gating control module 250 is capable of configuring the power gating component 220 to selectively couple the node 215 of the gated power domain 210 to the first power supply node 202.

The power gating control module 250 may be implemented in any suitable manner. For example, at least a part of the power gating control module 250 may form an integral part of a power management module (not shown) of the integrated circuit device 205. Additionally and/or alternatively, at least a part of the power gating control module 250 may comprise a stand-alone module arranged to receive one or more power gating control signals (not shown) from, say, a power management module (not shown) of the integrated circuit device 205.

The power gating control module 250 may be further arranged to configure the isolation component 240 to selectively isolate the capacitance 230 from the node 215 of the gated power domain 210. For the illustrated example, the power gating control module 250 is operably coupled to the input 242 of the isolation component 240, and arranged to provide the isolation control signal 245 thereto. In this manner, the power gating control module 250 is capable of configuring the isolation component 240 to selectively isolate the capacitance 230 from the node 215 of the gated power domain 210.

For some examples, the power gating control module 250 may be arranged to configure the isolation component 240 to isolate the capacitance 230 from the node 215 of the gated power domain 210, prior to un-gating the node 215 of the gated power domain 210. In this manner, the capacitance 230 may be isolated from the node 215 of the gated power domain 210 during power gating recovery, e.g. when the gated power domain 210 is subsequently un-gated, and thus re-coupled to the first power supply node 202 in the illustrated example. As a result, the rush of current during power gating recovery may be significantly reduced, and therefore any adverse effect on neighbouring circuits connected to the same power/ground supply may also be significantly reduced, without increasing the power-up time for the gated power domain 210. In some examples, for example with more complex circuitry, the node 215 may comprise multiple nodes.

For some example embodiments, the power gating control module 250 may be arranged to configure the isolation component 240 in order to isolate the capacitance 230 from the node 215 of the gated power domain 210 prior to the node 215 of the gated power domain 210 being gated, e.g. de-coupled, from the first power supply node 202. In this manner, the capacitance 230 may be de-coupled from the node 215 of the gated power domain 210 prior to the gated power domain 210 being powered down, thereby enabling the charge within the capacitance 230 to be substantially maintained; albeit with possibly some reduction due to leakage (in particular if the capacitance 230 is implemented using active devices).

The power gating control module 250 may be further arranged to subsequently configure the isolation component 240 to re-connect the capacitance 230 to the node 215 of the gated power domain 210 after a period T following an un-gating of the node 215 of the gated power domain 210. For example, the period T may be predefined to comprise a period that is sufficient to enable the circuitry of the gated power domain 210 (excluding the isolated capacitance 230) to be charged following the un-gating thereof. In this manner, the initial (reduced) rush of current drawn by the circuitry of the gated power domain 210, when it is subsequently un-gated, may be allowed to die down prior to re-connecting the capacitance 230 to the node 215. A second rush of current may be subsequently drawn by the capacitance 230 upon re-connection thereof to the node 215. However, the amplitude of such a second rush of current is likely to be substantially insignificant, with any resulting drops in the supply voltage at the first power supply node 202 within allowed margins.

In some examples, the power gating control module 250 may be further arranged to configure the isolation component 240 to progressively re-connect the capacitance 230 to the node 215 of the gated power domain 210 following un-gating of the node 215 of the at least one gated power domain 210. In this manner, by configuring the isolation component 240 to progressively re-connect the capacitance 230 to the node 215, the current flow drawn by the capacitance 230 upon its re-connection may be controlled/slowed, thereby enabling the second 'rush' of current to be minimised.

Although examples have been described whereby at least one isolation component 240 is operably coupled in series between at least one chargeable device, such as capacitance 230 and the at least one node 215 of the at least one gated power domain 210, other arrangements, such as connections in parallel may be used in other examples.

Thus, a simplified example of an integrated circuit device 200 comprising at least one power gating arrangement 205, and a power gating control module 250, has been described herein, wherein a magnitude of a rush of current drawn during the power gating recovery of a gated power domain 210 may be reduced without increasing the power-up time for the gated power domain 210. In particular, in some examples, the reduced rush of current drawn during the power gating recovery of the gated power domain 210 may be achieved by fractioning of the capacitance to be charged during the power gating recovery. As a result, a reduced current rush for the power gating recovery of the gated power domain 210 may be achieved without a need for regulating the charge current, or partitioning the gated power domain 210, and thus without increasing the power-up time therefore.

Figure 3:
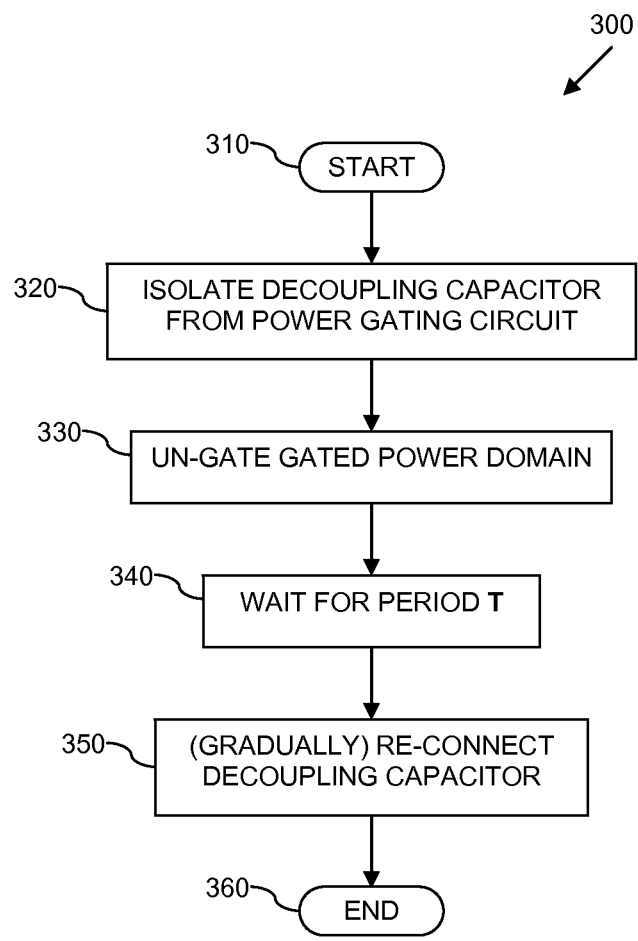
FIG. 3 illustrates a simplified flowchart of an example of a method of implementing power gating within an integrated circuit device.

Referring now to FIG. 3, there is illustrated a simplified flowchart 300 of an example of a method of implementing power gating for at least one power domain within an integrated circuit device, for example as may be implemented within the power gating control module 250 illustrated in FIG. 2. The method illustrated in FIG. 3 starts at 310, and moves on to 320 where at least one capacitance is isolated from at least one node of the at least one gated power domain. Next, at 330, the at least one gated power domain is un-gated. The method then waits for a period T, following un-gating of the at least one gated power domain at 340, following which the capacitance is re-connected, for example progressively, to the at least one node of the at least one gated power domain, at 350. The method then ends at 360.

Figure 4:
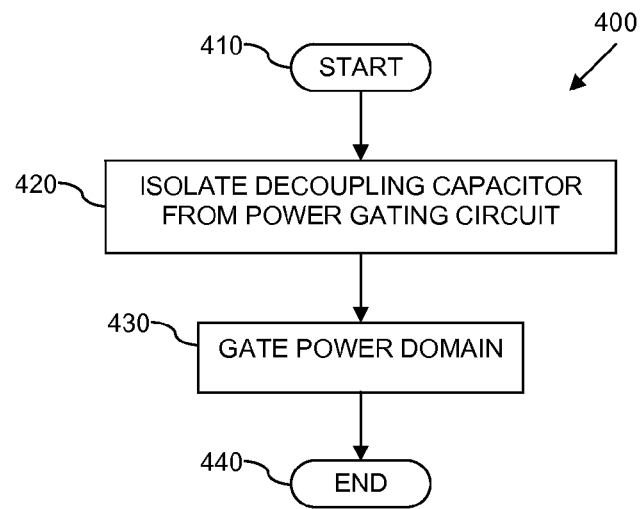
FIG. 4 and FIG. 5 illustrate simplified flowcharts of an alternative example of a method of implementing power gating within an integrated circuit device.
Figure 5:
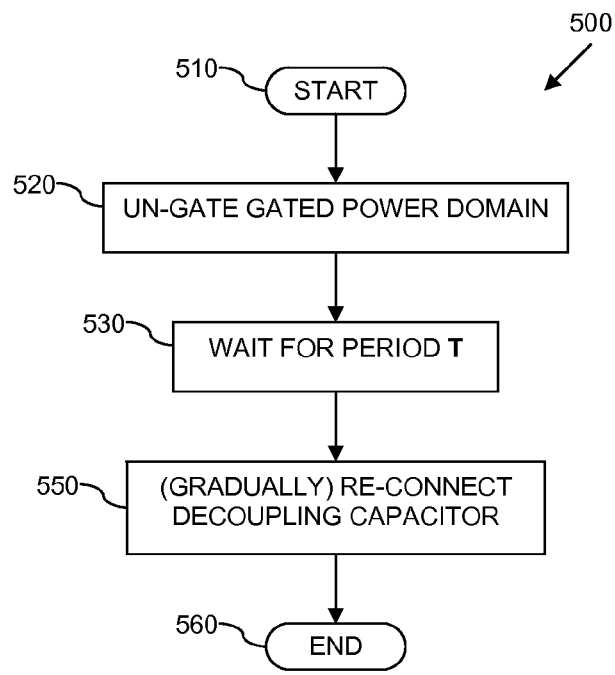

Referring now to FIGS. 4 and 5, there are illustrated simplified flowcharts 400, 500 of an alternative example of a method of implementing power gating for at least one power domain within an integrated circuit device, for example as may alternatively be implemented within the power gating control module 250 illustrated in FIG. 2. A first part of this method is illustrated in FIG. 4, and starts at 410, and moves on to 420 where at least one capacitance is isolated from at least one node of the at least one gated power domain. Next, at 430, the at least one gated power domain is gated. The first part of this method then ends at 440.

A second part of this method is illustrated in FIG. 5, and starts at 510, and moves on to 520, where the at least one gated power domain is un-gated. The method then waits for a period T following un-gating of the at least one gated power domain, at 530, following which the capacitance is re-connected, for example progressively, to the at least one node of the at least one gated power domain, at 540. The method then ends at 550.

Some parts of the invention, for example some or all of the power gating control module 250, may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system.

The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the power gating control module 250 of FIG. 2 has been illustrated as a single function block within the integrated circuit device. However, it will be appreciated that the functionality of the power gating control module 250 may equally be distributed across multiple function blocks.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, parts of the invention are not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit device comprising:
a power domain;
a power gating component operatively coupled between a node of the power domain and a power supply node to electrically couple the node of power domain to the power supply node when enabled;
an isolation component operatively coupled between a chargeable device and the node of the power domain to electrically couple the chargeable device to node of the power domain when enabled; and
a power gating control module coupled to the isolation component and to the power gating component to electrically de-couple the chargeable device from the node of the power domain, to electrically couple the power supply node while the chargeable device is electrically de-coupled from the node of the power domain, and, after waiting for a non-zero period of time and while the node of the power domain is electrically coupled to the power supply node, electrically couple the chargeable device to the node of the power domain.

2. The integrated circuit device of claim 1 wherein the isolation component is coupled in series between the chargeable device and the node of the power domain.

3. The integrated circuit device of claim 1 wherein the power gating component is arranged to receive a power gating control signal at an input thereof, and to electrically couple the node of the power domain to the power supply node in accordance with the received power gating control signal.

4. The integrated circuit device of claim 1 wherein the power gating component comprises a metal oxide semiconductor field effect transistor.

5. The integrated circuit device of claim 1 wherein the isolation component is arranged to receive an isolation control signal at an input thereof, and to electrically couple the chargeable device to the node of the power domain in accordance with the received isolation control signal.

6. The integrated circuit device of claim 5 wherein the isolation component comprises a metal oxide semiconductor field effect transistor.

7. The integrated circuit device of claim 1 wherein the power gating control module is further arranged to configure the isolation component to electrically de-couple the chargeable device from the node of the power domain prior to electrically coupling the node of the power domain to the power supply node.

8. The integrated circuit device of claim 1 wherein the power gating control module is further arranged to configure the isolation component to electrically de-couple the chargeable device from the node of the power domain prior to the node of the power domain being electrically decoupled from the power supply node.

9. The integrated circuit device of claim 7 wherein the power gating control module is further arranged to configure the isolation component to progressively electrically couple the chargeable device to the node of power domain, following electrically coupling the node of the power domain to the power supply node.

10. The integrated circuit device of claim 1 wherein the chargeable device comprises a capacitance such as a de-coupling capacitance.

11. A method of implementing power gating within an integrated circuit device, the method comprising:
electrically decoupling a chargeable device from a node of a power domain prior to electrically coupling the power domain to a power supply node;
subsequent to electrically decoupling the chargeable device, electrically coupling the power domain to the power supply node;
in response to electrically coupling the power domain to the power supply node, waiting a time period; and
in response to the time period ending and to the power domain being electrically coupled to the power supply node, electrically coupling the chargeable device to the node of the power domain.

12. The method of implementing power gating within an integrated circuit device of claim 11 wherein electrically decoupling the chargeable device is performed prior to the node of the power domain being electrically decoupled from the power supply node in order to maintain at least a part of a charge during a low power gating period.

13. An integrated circuit device comprising at least one power gating arrangement the at least one power gating arrangement) comprising:
at least one gated power domain;
at least one power gating component coupled between at least one node of the at least one gated power domain and at least a first power supply node, the at least one power gating component being arranged to selectively couple the at least one node of the at least one gated power domain to the at least first power supply node, wherein the at least one power gating arrangement further comprises at least one isolation component operably coupled between at least one chargeable device and the at least one node of the at least one gated power domain; and
a power gating control module coupled to the at least one isolation component and to the least one power gating component, the power gating control module to electrically decouple the at least one chargeable device from the at least one node of the at least one gated power domain, to electrically couple the at least first power supply node while the at least one chargeable device is electrically de-coupled from the at least one node of the at least one gated power domain, and, after waiting for a non-zero period of time and while the at least one node of the at least one gated power domain is electrically coupled to the at least first power supply node, electrically couple the at least one chargeable device to the at least one node of the at least one gated power domain.

14. The integrated circuit device of claim 13 wherein the at least one isolation component is coupled in series between the at least one chargeable device and the at least one node of the power domain.

15. The integrated circuit device of claim 13 wherein the at least one power gating component is arranged to receive a power gating control signal at an input thereof, and to electrically couple the at least one node of the power domain to the at least one power supply node in accordance with the received power gating control signal.

16. The integrated circuit device of claim 13 wherein the at least one power gating component comprises a metal oxide semiconductor field effect transistor.

17. The integrated circuit device of claim 13 wherein the at least one isolation component is arranged to receive an isolation control signal at an input thereof, and to electrically couple the at least one chargeable device to the at least one node of the power domain in accordance with the received isolation control signal.

18. The method of claim 11 further comprising:
receiving a power gating control signal; and
electrically coupling the node of the power domain to the power supply node in accordance with the received power gating control signal.

\* \* \* \* \*